(12) United States Patent
Shiah

(10) Patent No.: US 12,745,675 B2
(45) Date of Patent: Sep. 22, 2026

(54) MEMORY MODULE WITH REDUCED BONDING WIRES

(71) Applicant: ETRON TECHNOLOGY, INC., Hsinchu City (TW)

(72) Inventor: Chun Shiah, Hsinchu City (TW)

(73) Assignee: ETRON TECHNOLOGY, INC., Hsinchu (TW)

( * ) Notice: Subject to any disclaimer, the term of this patent is extended or adjusted under 35 U.S.C. 154(b) by 595 days.

(21) Appl. No.: 18/072,283

(22) Filed: Nov. 30, 2022

(65) Prior Publication Data

US 2023/0170330 A1 Jun. 1, 2023

Related U.S. Application Data

(60) Provisional application No. 63/284,667, filed on Dec. 1, 2021.

(51) Int. Cl.
*H10W 90/00* (2026.01)

(52) U.S. Cl.
CPC .......... *H10W 90/00* (2026.01); *H10W 90/722* (2026.01); *H10W 90/754* (2026.01)

(58) Field of Classification Search
CPC ......... H01L 25/0657; H01L 2225/0651; H01L 2225/06513; H10B 80/00; H10W 90/00; H10W 90/754; H10W 90/722
See application file for complete search history.

(56) References Cited

U.S. PATENT DOCUMENTS

2013/0015571 A1* 1/2013 Chun ...................... H01L 24/14 257/737

FOREIGN PATENT DOCUMENTS

KR 102053349 * 12/2019

* cited by examiner

*Primary Examiner* — Timor Karimy
(74) *Attorney, Agent, or Firm* — WPAT, PC

(57) ABSTRACT

The invention provides a memory module, comprising a first memory die with a first surface and a third surface opposite to the first surface, wherein a first redistribution layer and a first original pad set are formed over the first surface; a second memory die with a second surface and a fourth surface opposite to the second surface, wherein a second original pad set are formed over the second surface; a wire bonding pad set disposed over the first surface, wherein the wire bonding pad set are electrically connected with the first original pad set; and a plurality of wires bonded to the wire bonding pad set, wherein the first memory die is bonded to the second memory die, the first surface faces the second surface, and the second original pad set are electrically connected with the wire bonding pad set.

16 Claims, 18 Drawing Sheets

MEMORY MODULE WITH REDUCED BONDING WIRES

CROSS REFERENCE TO RELATED APPLICATION

The present application claims priority to U.S. provisional patent application Ser. No. 63/284,667 filed on Dec. 1, 2021, the entire content of which is incorporated by reference to this application.

BACKGROUND OF THE INVENTION

1. Field of the Invention

The present invention pertains to a memory module, more specifically to a dual-chip packaging memory module with reduced bonding wires.

2. Description of the Prior Art

During the manufacturing process of a conventional memory packaging module with memory chip, the memory chip is connected to a substrate (which could be a silicon interpose, PCB substrate, or other semiconductor chip such as logic chip) by wire bonding, and then the memory chip and the substrate are enclosed by molding compound to form a packaging module. Please refer to FIG. 1A and FIG. 1B which are schematic diagrams of the package module in the prior art from side view and top view, respectively. As shown in FIG. 1A, the conventional memory packaging module 8 has a memory chip 80 and a substrate 81, and the memory chip 80 and the substrate 81 are connected by wire bonding, so that the bonding wire 810 is used to connect the memory chip 80 and the substrate 81.

As shown in FIG. 1B, the memory chip 80 includes original pads 800*a* (such as, address pads, data I/O pads, command pads) which are located within the center portion of the memory chip 80, re-distribution layer (RDL) which re-route the original pads, and the RDL pads (or bonding pads) 800*b* which are located on the peripheral or edge portion of the memory chip 80. The re-distribution layer may include a plurality of metal sublayers. The RDL pads (or bonding pads) 800*b* are electrically coupled to the original pads 800*a* through the RDL, and the RDL pads 800*b* may include address pads and command pads 801 (such as XCLK (clock signal), XCMD (command signals), and XADD (address signals), all of which are defined in JEDEC), power pads 802 (such as Powers, GNDs), and data I/O pads 803 (such as DQ0-15 (data signals), DQS0-1 (data strobe signals), all of which are defined in JEDEC). The RDL pads 800*b* located on the peripheral or edge portion of the memory chip 80 are then easily connected to the substrate 81 through the bonding wire 810.

In order to increase the storage capacity, the industry has tried to put dual or more memory chips in one package unit. Please refer to FIG. 2A and FIG. 2B which are schematic diagrams of another memory package module 9 in the prior art from side view and top view, respectively. As shown in FIG. 2A and FIG. 2B, a bottom memory chip 90 and a top memory chip 91 stacked on the bottom memory chip 90 are in the dual-memory package module 9. In order to connect the bottom memory chip 90 and the top memory chip 91 to the substrate 92 by wire bonding, the RDL pads of the bottom memory chip 90 and the top memory chip 91 need to face the same direction. It can be seen from FIG. 2A and FIG. 2B that the bottom memory chip 90 and the substrate

92 are connected with a bonding wire 920, and the top memory chip 91 and the substrate 92 are connected with a bonding wire 921. The RDL pads of the bottom memory chip 90 and the top memory chip 91 both face upwardly in FIG. 2B.

However, each memory chip 90 and 91 has a considerable number of RDL pads, and those RDL pads need corresponding bonding wires for connecting the substrate 92, so that the substrate 92 may be connected to dozens of bonding wires at the same time. Since the amount of the bonding wires is huge and the wire routing is complicated, it will increase the bonding cost, and wire/signal interference is also likely to occur between the bonding wires. Accordingly, the industry needs a new memory module that can be applied to multiple memory chips and can reduce the number of wire bonding wires, thereby reducing the packaging cost of the memory module.

SUMMARY OF THE INVENTION

The invention provides a memory module to reduce the number of the bonding wire. The memory module comprises a first memory die and a second memory die. The first memory die has a first surface, wherein a first redistribution layer and a first original pad set are formed over the first surface. The second memory die has a second surface, wherein a second original pad set are formed over the second surface. A wire bonding pad set are disposed over the first surface of the first memory die, wherein the wire bonding pad set are electrically connected with the first original pad set through the first redistribution layer. A plurality of wires are bonded to the wire bonding pad set; wherein the first memory die is bonded to the second memory die, the first surface of the first memory die faces the second surface of the second memory die, and the second original pad set are electrically connected with the wire bonding pad set.

In one aspect of the present invention, there is no wire bonded to the second memory die. Furthermore, the first memory die further comprises a third surface opposite to the first surface and the second memory die further comprises a fourth surface opposite to the first surface, wherein there is no pad set and redistribution layer disposed over the third surface of the first memory die, and there is no pad set and redistribution layer disposed over the fourth surface of the second memory die.

In another aspect of the present invention, a first intermediate pad set are disposed over the first surface of the first memory die, and the first intermediate pad set are electrically connected with the first original pad set through the first redistribution layer.

In another aspect of the present invention, the second original pad set of the second memory die are bonded to the first intermediate pad set of the first memory die.

In another aspect of the present invention, a first intermediate pad set are disposed over the first surface of the first memory die, and the first intermediate pad set are electrically connected with the first original pad set through the first redistribution layer; wherein a second intermediate pad set are disposed over the second surface of the second memory die, and the second intermediate pad set are electrically connected with the second original pad set through a second redistribution layer.

In another aspect of the present invention, the second intermediate pad set of the second memory die are bonded to the first intermediate pad set of the first memory die.

In another aspect of the present invention, the position arrangement of the second intermediate pad set of the second memory die are mirrored with the position arrangement of the second original pad set of the second memory die along a horizontal direction or a vertical direction.

In another aspect of the present invention, a data width in the wire bonding pad set is the same as that in the first original pad set and the same as that in the second original pad set.

In another aspect of the present invention, a data width in the wire bonding pad set is the sum of that in the first original pad set and that in the second original pad set.

In another embodiment of the present invention, the memory module with reduced bonding wires comprises a first memory unit and a second memory unit. The first memory unit has a first surface, wherein a first original pad set and a first intermediate pad set are disposed over the first surface, and a first redistributed layer is over the first surface to connect the first original pad set with the first intermediate pad set. A first wire bonding pad set and a second wire bonding pad set are disposed over an peripheral position of the first surface; wherein the first wire bonding pad set and the second wire bonding pad set are connected with the first original pad set through the first redistributed layer. The second memory unit with a second surface, and a second original pad set are disposed over the second surface. Wherein the second surface of the second memory unit is flipped and bonded to the first surface of the first memory unit, and the second original pad set are electrically connected with the first wire bonding pad set and the second wire bonding pad set through the first intermediate pad set and the first redistributed layer; and wherein no wire is bonded to the second memory unit.

In one aspect of the present invention, the peripheral position over which the first wire bonding pad set and the second wire bonding pad set are disposed at least includes a first edge portion extending along a first direction and a second edge portion extending along a second direction, wherein the first direction is different from the second direction.

In another aspect of the present invention, the second wire bonding pad set comprises a first data pad set and a second data pad set, wherein an original data pad set of the first original pad set are directly connected to the first data pad set through the first redistributed layer, and an intermediate data pad set of the first intermediate pad set are directly connected to the second data pad set through the first redistributed layer.

In another aspect of the present invention, the first memory unit comprises a first core circuit and a first peripheral circuit, the second memory unit comprises a second core circuit and a second peripheral circuit; wherein part of the second peripheral circuit is disable during the operation of the memory module.

In another aspect of the present invention, part of the second peripheral circuit includes an internal regulated voltage source, a command controller, a clock circuit or an addressing decoding circuit.

In another aspect of the present invention, the second memory unit does not include an internal regulated voltage source, a command controller, or a clock circuit.

In another embodiment of the present invention, the memory module with reduced bonding wires comprises a substrate, a first memory unit and a second memory unit. The first memory unit has a first redistribution layer over a first surface of the first memory unit; and the second memory unit has a second redistribution layer over a second surface of the second memory unit. The second surface of the second memory unit is flipped and bonded to the first surface of the first memory unit through a plurality of micro bumps; wherein the substrate is electrically connected to the first redistribution layer through a plurality of wires, and the second redistribution layer is electrically connected to the first redistribution layer through the plurality of micro bumps. Furthermore, there is no wire bonded between the substrate and the second memory unit.

To sum up, the memory module provided by the present invention has a first memory unit and a second memory unit, and only the first memory unit is connected to a substrate by wire bonding. In addition, part of the functions of the second memory unit can be performed by the first memory unit, thereby reducing the operation power (when those function of the second memory unit is disable) or the die area of the second memory unit (when those function of the second memory unit is removed from the second memory unit).

BRIEF DESCRIPTION OF THE APPENDED DRAWINGS

Figure 6A:
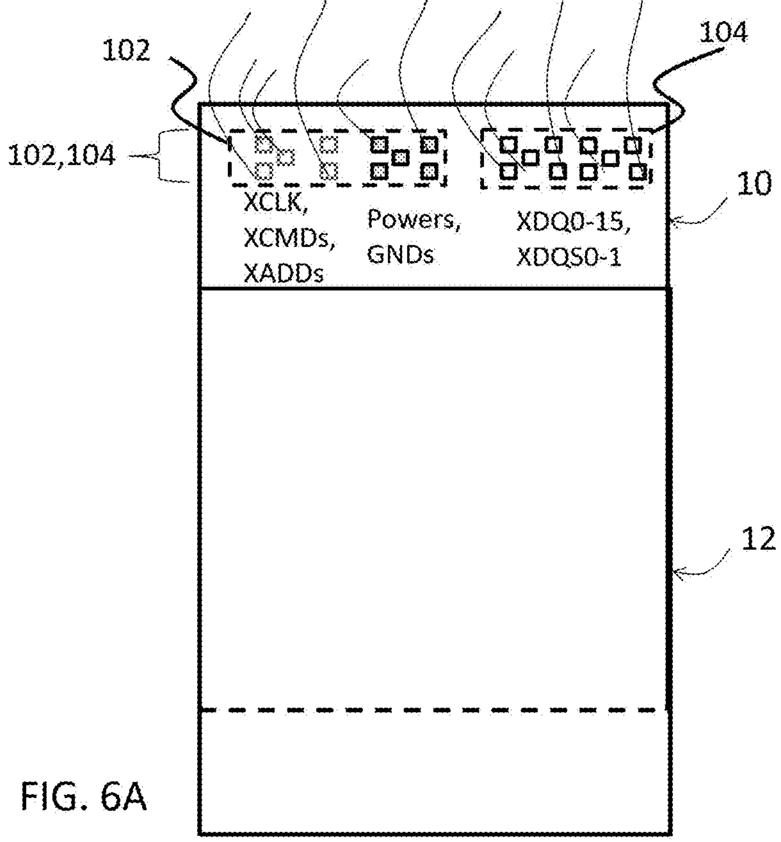
Figure 6B:
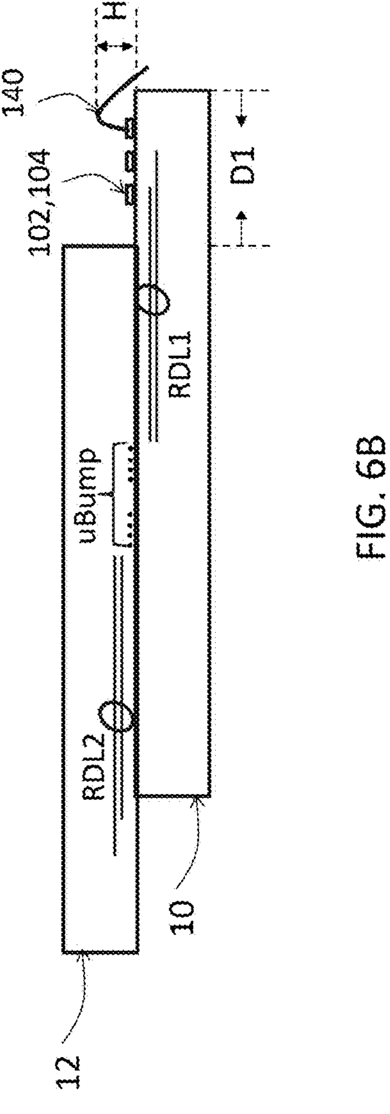

FIG. 6A (top view) and FIG. 6B (side view) shows one configuration circuit of the present invention.

Figure 6C:
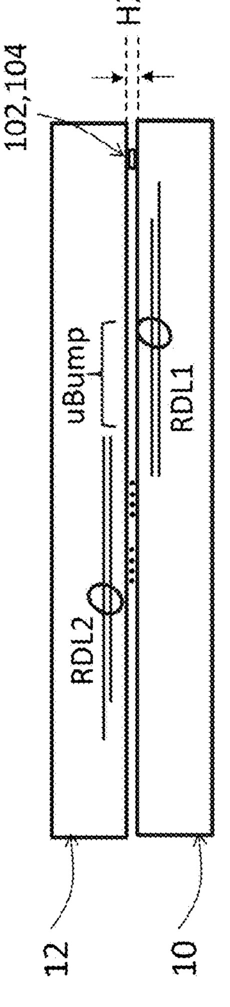

FIG. 6C (side view) shows another configuration circuit of the present invention.

Figure 7:
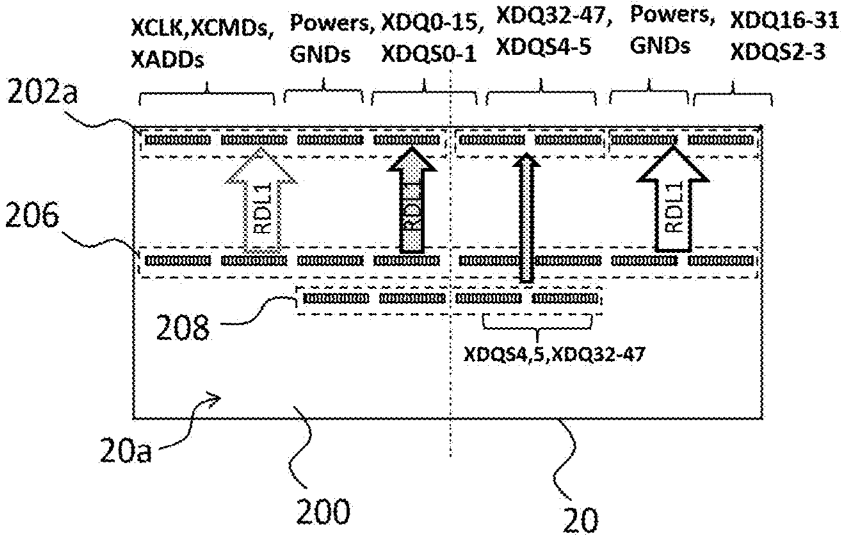

FIG. 7 show main surface of the first memory unit with two dice according to an embodiment of the present invention.

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1A:
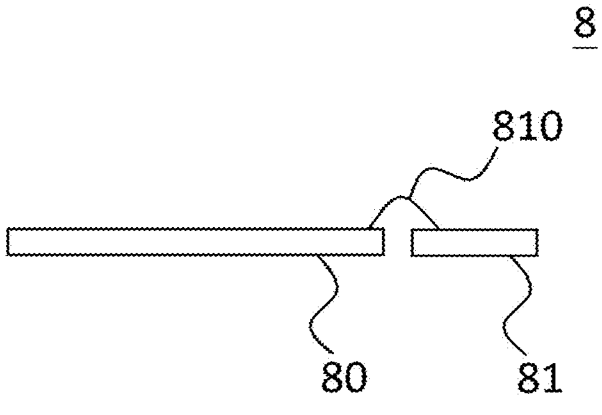
FIG. 1A and FIG. 1B are schematic diagram of a memory module in the prior art.
Figure 1B:
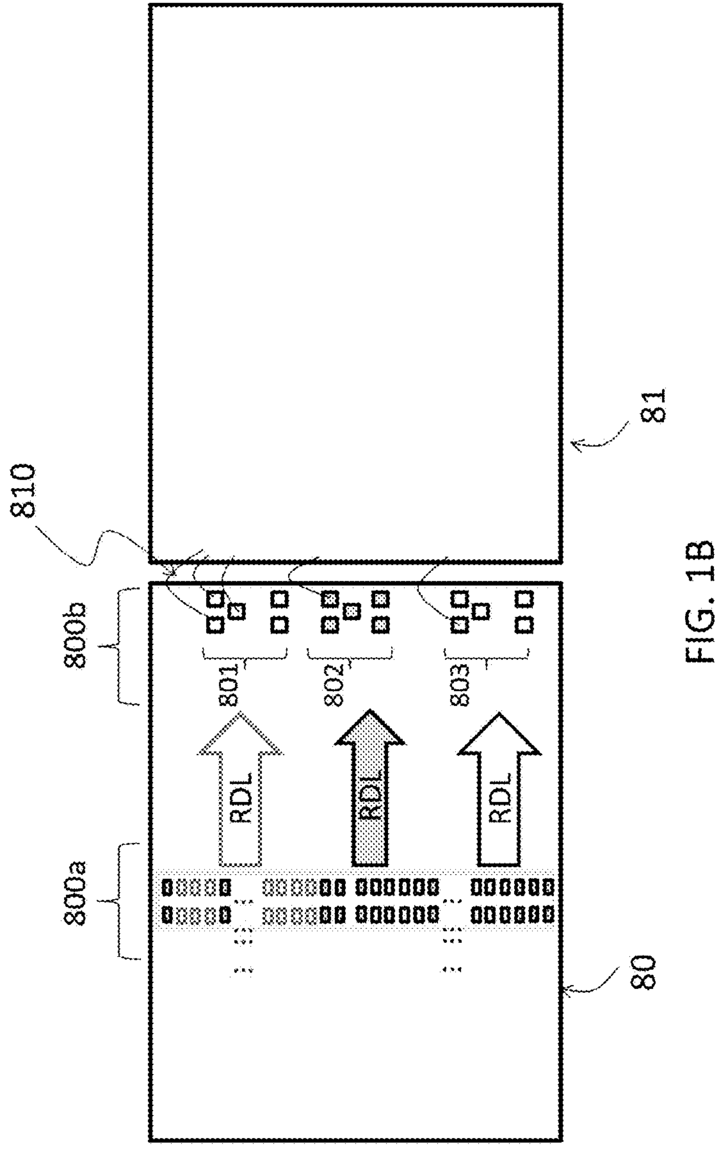
Figure 2A:
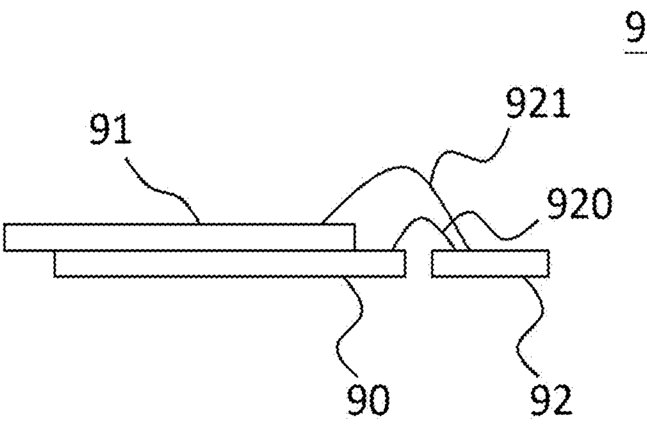
FIG. 2A and FIG. 2B are a schematic diagram of another memory module in the prior art.
Figure 2B:
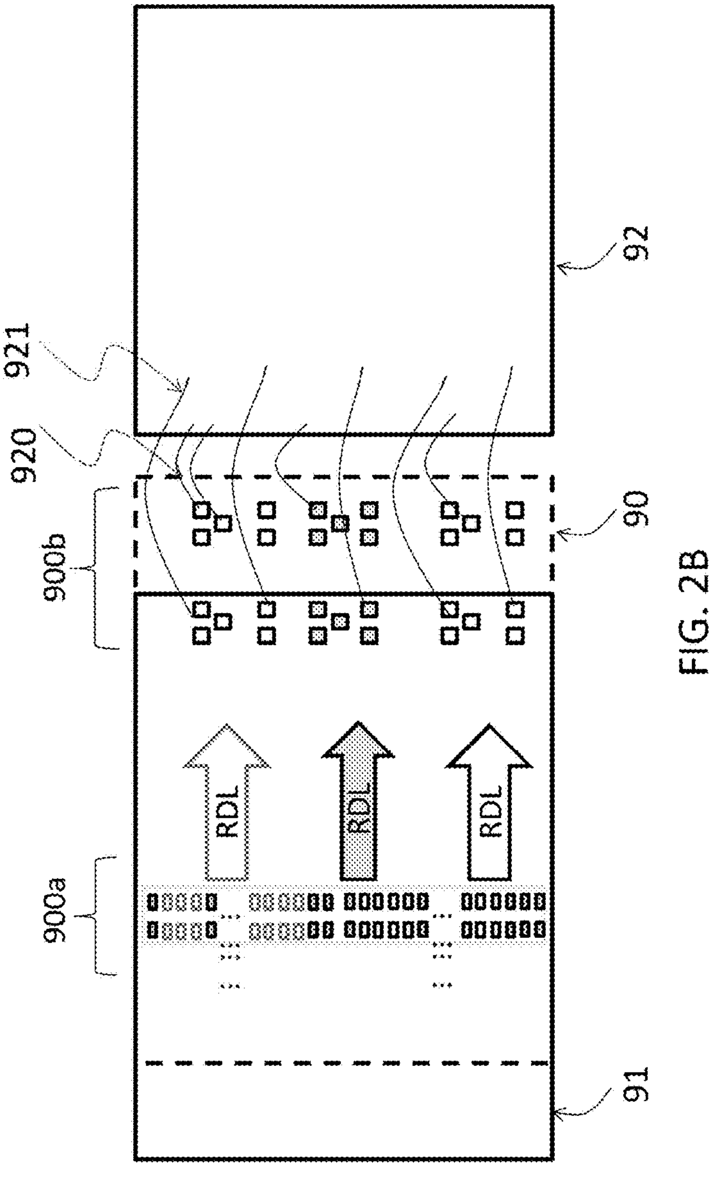
Figure 3A:
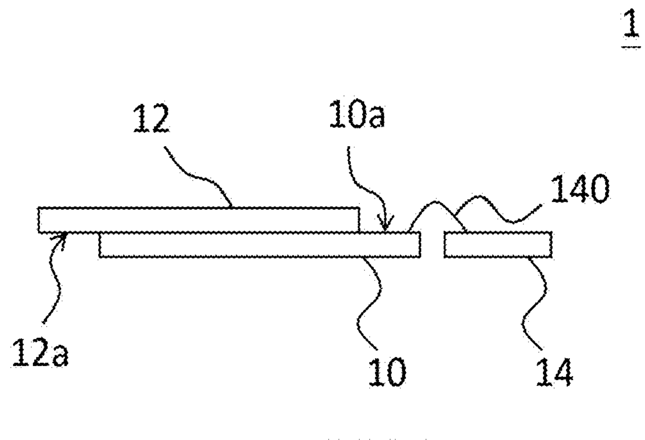
FIG. 3A is a side view of a memory module according to an embodiment of the present invention.
Figure 3B:
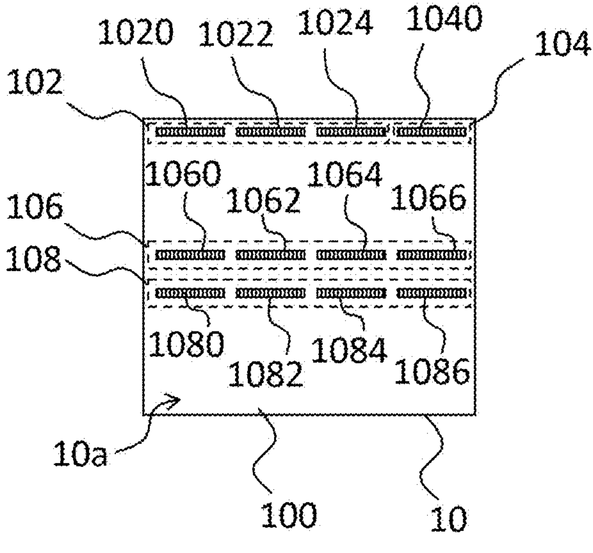
FIG. 3B-FIG. 3F shows main surfaces of the first memory unit and the second memory unit with pads.
Figure 3C:
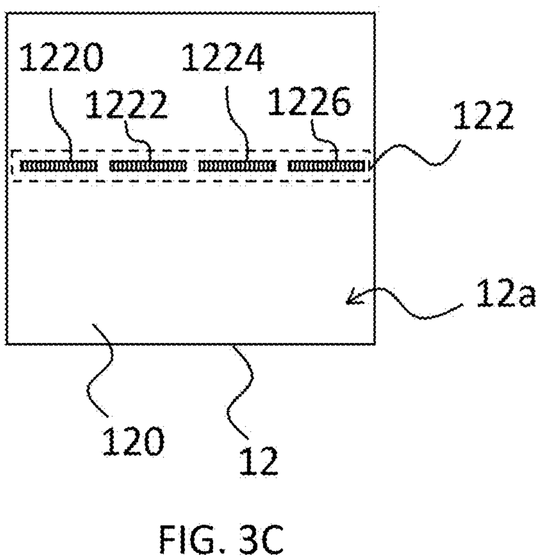

Please refer to FIG. 3A, FIG. 3B and FIG. 3C together, FIG. 3A illustrates a side view of a memory module with a first memory unit 10 and a second memory unit 12 according to an embodiment of the present invention, FIG. 3B illustrates a top view of the first memory unit 10 according to an embodiment of the present invention, and FIG. 3C illustrates a bottom view of the second memory unit 20 which could be flipped to the first memory unit 10 according to an embodiment of the present invention. Viewed from the vertical direction in FIG. 3A, the first memory unit 10 is overlapped under the second memory unit 12. Moreover, the surface of the first memory unit 10 facing the second memory unit 12 may be defined as a first surface 10*a*, the surface of the second memory unit 12 facing the first memory unit 10 may be defined as a second surface 12*a*, and the second surface 12*a* can be attached to the first surface 10*a*. In one example, the memory module 1 further has a substrate 14 (such as a BGA substrate or a SOC die), and the substrate 14 is electrically connected to the first memory unit 10 and the second memory unit 12. Different from the prior art, in the memory module 1 of the present embodiment, only the first memory unit 10 and the substrate 14 are connected through bonding (such as wire bonding), and there is no wires connecting the second memory unit 12 to the substrate 14.

The first memory unit 10 is provided with a first metal layer 100 on the first surface 10*a*, and the first metal layer 100 may be a laminated structure such as redistribution layers (RDL). FIG. 3B shows several pad set disposed on the first surface 10*a*, such as a first wire bonding pad set (or first RDL pads set) 102, a second wire bonding pad set (or second RDL pads set) 104, a first original pads set 106, and a first intermediate pad set 108. In practice, the first wire bonding pad set 102 and the second wire bonding pad set 104 are disposed on the peripheral portion of the first surface 10*a*, the first original pad set 106 is distributed in the center portion of the first surface 10*a*, and the first intermediate pad set 108 may be either distributed in the center portion or peripheral portion of the first surface 10*a*. Similarly, in FIG. 3C the second memory unit 12 may be provided with a second original pad set 122 on the second surface 12*a.*

The first surface 10*a* can be regarded as the main surface of the first memory unit 10, and the second surface 12*a* can be regarded as the main surface of the second memory unit 12. Since the second surface 12*a* of the second memory unit 12 is attached to the first surface 10*a* of the first memory unit 10, the stacked first memory unit 10 and the second memory unit 12 can be regarded as a face to face structure. In one embodiment, another surface of the first memory unit 10 opposite to the first surface 10*a* does not include any pad and/or redistribution layer, and another surface of the second memory unit 12 opposite to the second surface 12*a* does not include any pad and/or redistribution layers.

Figure 3D:
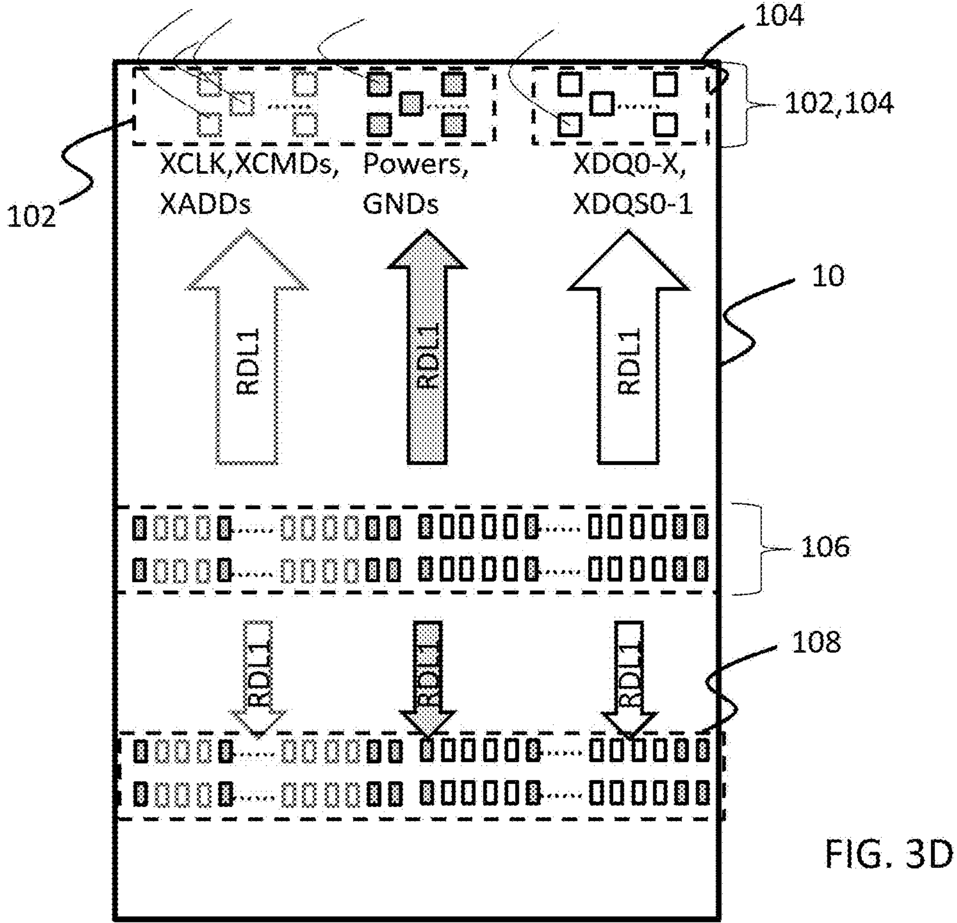

In one example of the present invention, as shown in FIG. 3D, the first original pad set 106 disposed on the first surface 10*a* can be electrically connected to the first wire bonding pad set 102 and the second wire bonding pad set 104 through the first redistribution layer RDL1. The first redistribution layer RDL1 may includes a plurality of metal sublayers. The first original pad set 106 includes original address pads and original command pads (such as XCLK,XCMD,XADD), original power pads (such as Powers, GNDs), and original data I/O pads (such as DQ0-x, DQS). As shown in FIG. 3D, the first wire bonding pad set 102 includes corresponding address pads, command pads, and corresponding power pads. The second wire bonding pad set 104 includes corresponding data I/O pads.

Figure 3E:
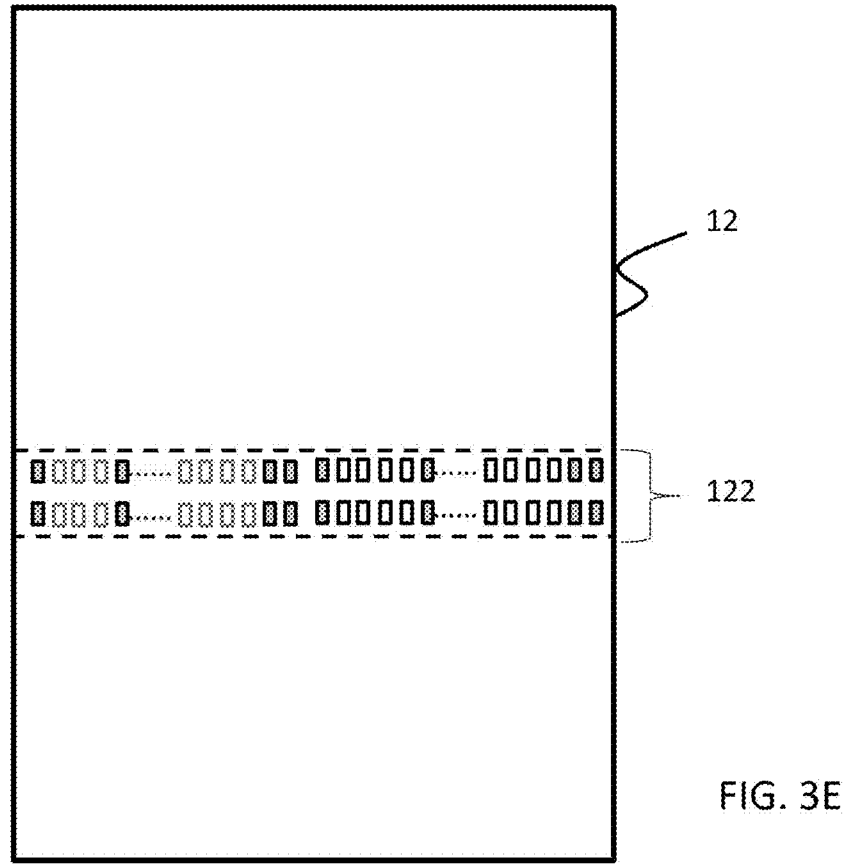

Moreover, the first intermediate pad set 108 on the first surface 10*a* can be electrically connected to the first original pad set 106 through the first distribution layer RDL1. The first intermediate pad set 108 may include intermediate address pads, intermediate command pads, intermediate power pads, and intermediate data I/O pads. Then, the second original pad set 122 of the second memory unit 12 shown in FIG. 3E could be connected or bonded to the first intermediate pad set 108 of the first memory unit 10 in FIG. 3D through solder bonding, micro bump bonding or other bonding. Of course, the second original pad set 122 also includes original address pads and original command pads (such as XCLK,XCMD,XADD), original power pads (such as Powers, GNDs), and original data I/O pads (such as DQ0-y, DQS).

Figure 3F:
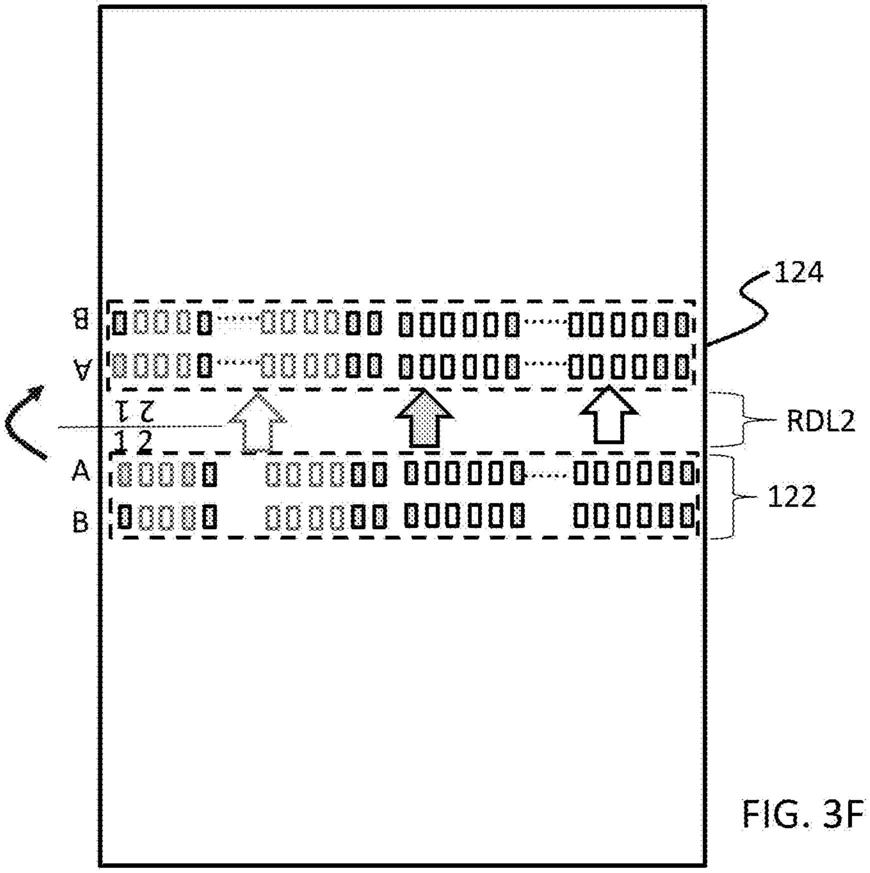

In another embodiment shown in FIG. 3F, the second memory unit 12 may include the second intermediate pad set 124 disposed on the second surface 12*a*. The second original pad set 122 is connected to the second intermediate pad set 124 through the second redistribution layer (RDL2). The second redistribution layer RDL2 may includes a plurality of metal sublayers. The second intermediate pad set 124 also includes intermediate address pads, intermediate command pads, intermediate power pads, and intermediate data I/O pads. Depending on how the second memory unit 12 is flipped to the first memory unit 10, the position arrangement of the second intermediate pad set 124 could be mirrored with the position arrangement of the second original pad set 122 along the horizontal direction (as shown in FIG. 3F) or the vertical direction. Thereafter, the second intermediate pad set 124 of the second memory unit 12 shown in FIG. 3F could be connected or bonded to the first intermediate pad set 108 of the first memory unit 10 in FIG. 3D through solder bonding, micro bump bonding or other bonding.

Figure 3G:
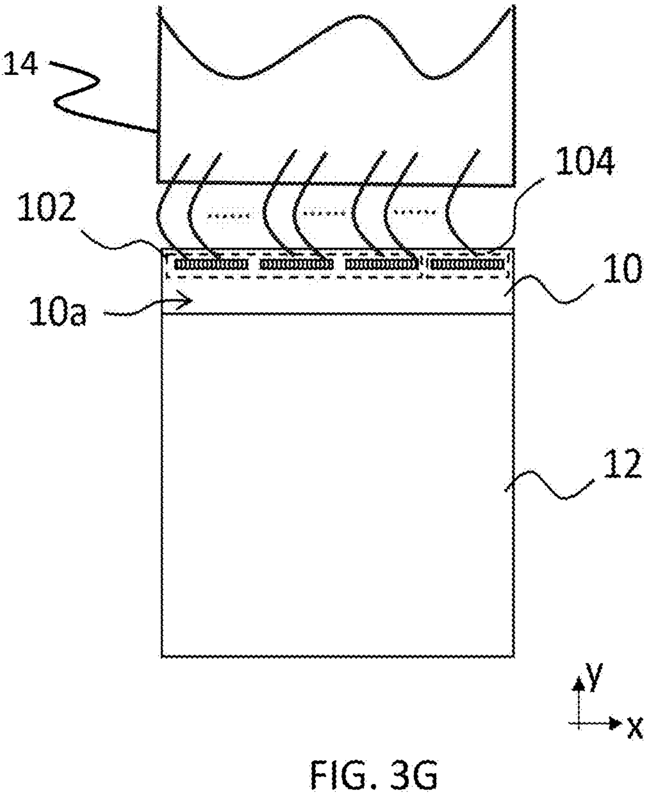
FIG. 3G illustrates a top view of the stacked first memory unit and the second memory unit according to an embodiment of the present invention.
Figure 3H:
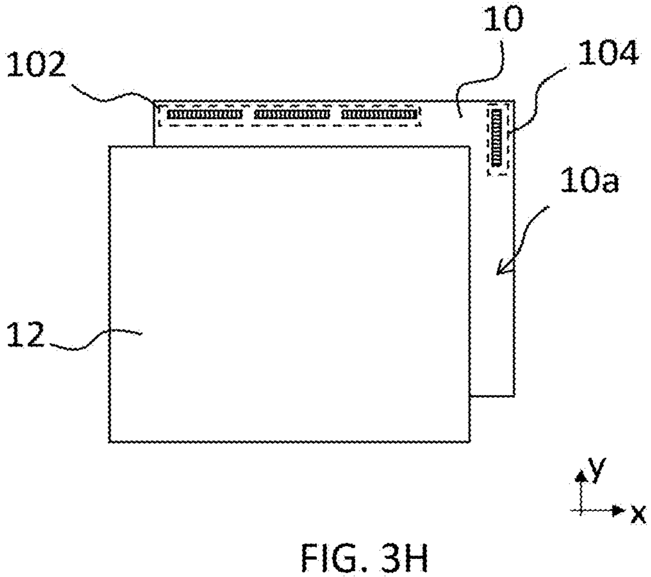
FIG. 3H illustrates a top view of the stacked first memory unit and the second memory unit according to another embodiment of the present invention.

Since the second memory unit 12 is stacked on the first memory unit 10, the first wire bonding pad set 102 and the second wire bonding pad set 104 should not be covered by the second memory unit 12, as shown in FIG. 3G. Therefore, the substrate 14 can be connected to both of the first wire bonding pad set 102 and the second wire bonding pad set 104 by bonding the bonding wire 140. As shown in FIG. 3G, the first memory unit 10 and the second memory unit 12 may be related to the same/overlapping centerline, and the first memory unit 10 and the second memory unit 12 are only misaligned in the y-axis direction. FIG. 3H illustrates a top view of the stacked first memory unit 10 and the second memory unit 12 according to another embodiment of the present invention. The first memory unit 10 and the second memory unit 12 may be misaligned in both the x-axis direction and the y-axis direction, and the wire bonding pad set 102 and the wire bonding pad set 104 could be distributed on two sides or more sides of the first surface 10*a*. The size of the first memory unit 10 may be the same as or different from that of the second memory unit 12.

In an example, the first wire bonding pad set 102 in FIG. 3B may be defined with multiple subsets, such as a subset 1020, a subset 1022, and a subset 1024 (corresponding to address pads, command pads, power pads respectively), and the second wire bonding pad set 104 may also have a subset 1040 (corresponding to data I/O pads). Similarly, the first original pad set 106 and the first intermediate pad set 108 may also be defined with multiple subsets. For example, the first original pad set 106 may have a subset 1060, a subset 1062, a subset 1064 (corresponding to address pads, command pads, power pads respectively), and a subset 1066 (corresponding to data I/O pads). Furthermore, the first intermediate pad set 108 may have a subset 1080, a subset 1082, a subset 1084 (corresponding to address pads, command pads, power pads respectively), and a subset 1086 (corresponding to data I/O pads). In practice, the subset 1060, the subset 1062, the subset 1064 and the subset 1066 are electrically connected to the subset 1020, the subset 1022, the subset 1024 and the subset 1040 respectively by the first metal layer 100 or RDL1, and also electrically connected to the subset 1080, the subset 1082, the subset 1084 and the subset 1086 respectively by t the first metal layer 100 or RDL1.

Furthermore, as shown in FIG. 3C, the second original pad set 122 may also have a subset 1220, a subset 1222, a subset 1224 (corresponding to address pads, command pads, power pads respectively), and a subset 1226 (corresponding to data I/O pads). The subset 1220, the subset 1222, the subset 1224 and the subset 1226 may one-to-one correspond to the subset 1080, the subset 1082, the subset 1084, and the subset 1086 of the first intermediate pad set 108, respectively. The second original pad set 122 and the first intermediate pad set 108 may be electrically coupled by solder, micro-Cu pillar bumps or other bonding.

Figure 4:
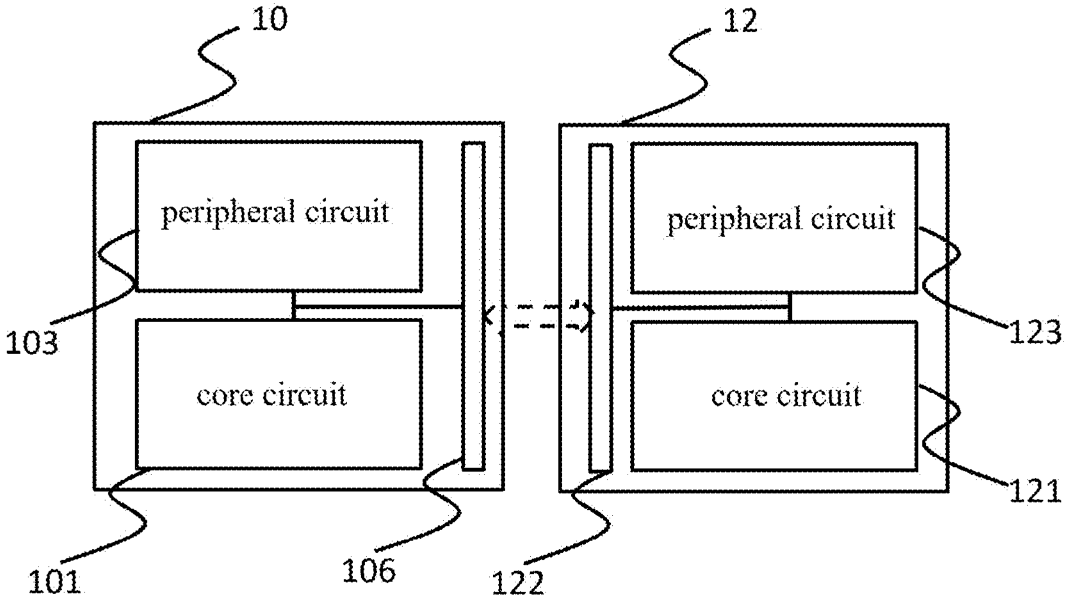
FIG. 4 is a diagram illustrating connected DRAM semiconductor chips according to the present invention.

Please refer to FIG. 4 which is a diagram illustrating two connected DRAM semiconductor chips according to the present invention. As shown in the figures, one semiconductor chip (corresponding to the first memory unit 10) includes a first peripheral circuit 101 and a first core circuit 103, and the first original pad set 106 of the first memory unit 10 is electrically coupled to the first peripheral circuit 101 and the first core circuit 103. Similarly, the other semiconductor chip (corresponding to the second memory unit 12) can also include a second peripheral circuit 121 and a second core circuit 123, and the second original pad set 122 of the second memory unit 12 is electrically coupled to the second peripheral circuit 121 and the second core circuit 123. Each of the first peripheral circuit 101 and the second peripheral circuit 121 may include circuits such as an address decoder, clock circuit, command controller, internal regulated voltage sources, etc. Each of the first core circuit 103 and the second core circuit 123 may include memory arrays and sense amplifiers (SA).

Since the second original pad set 122 of the second memory unit 12 is electrically coupled to the first intermediate pad set 108 and/or the first original pad set 106 of the first memory unit 10, the internal voltage generated by the internal regulated voltage sources of the first peripheral circuit 101 could be passed to the second memory unit 12. Therefore, the internal regulated voltage sources in the second peripheral circuit 121 could be disable for power saving, and vice versa. Moreover, since the signals (including command control signals, address decoding signals, clock signals) of the first memory unit 10 can also be connected to those of the second memory unit 12, the command controller, clock circuits and addressing decoding circuits of the second memory unit 12 can be disabled to save power, and vice versa.

Figure 5:
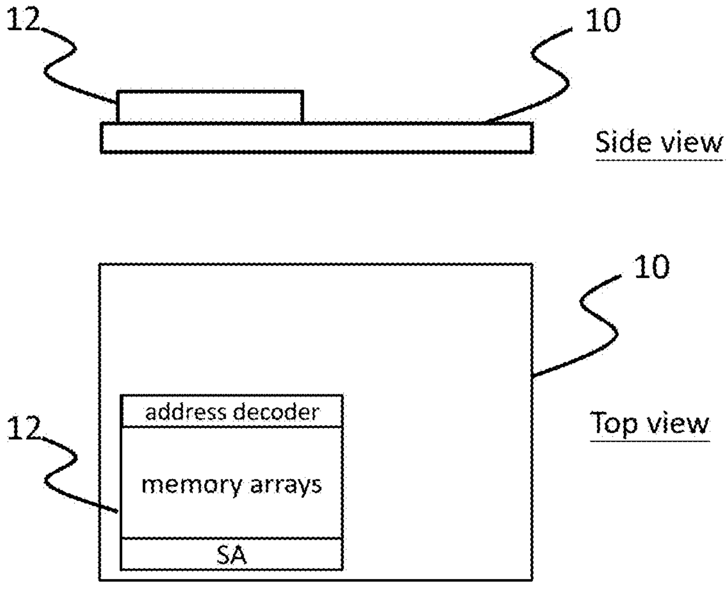
FIG. 5 is a diagram illustrating another connected DRAM semiconductor chips according to the present invention.

In another embodiment, those disable circuits mentioned in the above could be removed from one of the second memory unit 12 and the first memory unit 10. For example, as shown in FIG. 5, the first memory unit 10 is a complete DRAM chip with full peripheral circuit 101 core circuit 103 (such as 4 Gb). However, the second memory unit 12 on the top just includes memory arrays (such as 1 Gb), decoders, and sense amplifiers, and has address bus, control signals and internal I/O buses connected to the first memory unit 10 through micro-bump. In another embodiment, there could be two or more the second memory units 12 described in FIG. 5 on the surface of the first memory unit 10.

Different configurations could be realized according to the present invention. As shown in FIG. 6A (top view) and FIG. 6B (side view), the first memory unit 10 and the second memory unit 12 share the first wire bonding pad set 102 which includes address pads and command pads (such as XCLK,XCMD,XADD) and power pads (such as Powers, GNDs). It could reduce 30-40 bonding wires on the second memory unit 12. Furthermore, in the event each of the first memory unit 10 and the second memory unit 12 has same data width (such as 8 bits or "X8"), the original data I/O pads (X8) of the first memory unit 10 is coupled to a portion of the second wire bonding pad set 104 through RDL1, and the original data I/O pads (X8) of the second memory unit 12 could be coupled to another portion of the second wire bonding pad set 104 through RDL2, micro bumps ("uBump"), and RDL1. Thus, the second wire bonding pad set 104 could have 16 bits or "X16" data width. In an embodiment, the first memory unit 10 and the second memory unit 12 can be connected by using the "reverse wire bond technique" when bonding environment on the peripheral or edge portion of the first memory unit 10 is not so complicated. For example, the first wire bonding pad set 102 and/or the second wire bonding pad set 104 may have only 1 row of pads, so that both of the top die (the second memory unit 12) and the bottom die (the first memory unit 10) can be 100% overlapped, therefore no extra extended distance D1 (shown in FIG. 6B) is needed for bonding. Besides, the height required for bonding the bonding wire shown in FIG. 6B can be illustrated as the height H1, the height of the pads shown in FIG. 6C (the first wire bonding pad set 102 and/or the second wire bonding pad set 104) can be illustrated as the height H2. Person having ordinary skill in the art can understand that the height H1 should be much larger than the height H2, therefore the embodiment of FIG. 6C can occupy a smaller dice space than the embodiment of FIG. 6B.

The following table shows three possible configurations according to the present invention or "DRAM Doubler" which could increase the bandwidth (Configuration 1 and Configuration 2) or storage capacity (Configuration 3):

| | Configuration 1 | Configuration 2 | Configuration 3 |
|---|---|---|---|
| the first memory unit 10 (DRAM Die1) | original data I/O pads: X8 (uses RDL1 to connect its original pads to wire bonding pads in the first memory unit 10) | original data I/O pads: X32 (uses RDL1 to connect its original pads to wire bonding pads in the first memory unit 10) | original data I/O pads: X16 (uses RDL1 to connect its original pads to wire bonding pads in the first memory unit 10) |
| the second memory unit 12 (DRAM Die2) | original data I/O pads: X8 (uses RDL2, uBump, RDL1 to connect its original pads to wire bonding pads in the first memory unit 10) | original data I/O pads: X16 (uses RDL2, uBump, RDL1 to connect its original pads to wire bonding pads in the first memory unit 10) | original data I/O pads: X16 (uses RDL2, uBump, RDL1 to connect its original pads to wire bonding pads in the first memory unit 10) |
| Dram Doubler | Total data width: X16 (Same XCS shared between Die 1&2, "XCS" is "chip select" defined in JEDEC) | Total data width: X48 (Same XCS shared between Die 1&2) | Total data width: X16 (XCS1 controls Die1, XCS2 controls Die2) |

In configuration 3, the first memory unit 10 and the second memory unit 12 share the second wire bonding pad set 104 which includes data I/O pads (such as DQ0-x, DQS), thus, DRAM Die1 has its own XCS1 pad and DRAM Die2 has its own XCS2 pad for separate selection purpose. The bandwidth of the DRAM Doubler in Configuration 3 is the same as that of the first memory unit 10 and the second memory unit 12, however, the total storage capacity of the DRAM Doubler in Configuration 3 will be double, as compared with that of the first memory unit 10 and the second memory unit 12.

In configuration 2, the chip sizes of the first memory unit 10 and the second memory unit 12 are different. For example, during wafer dicing, the chip corresponding to the first memory unit 10 may be sliced in two dice, and the chip of the second memory unit 12 may be a single die. Please refer to FIG. 3C and FIG. 7 together. FIG. 7 is a stereoscopic diagram illustrating another embodiment of the present invention. Similar to the first memory unit 10 shown in FIG. 3B, the first memory unit 20 shown in FIG. 7 also defines a first surface 20*a*, and the first surface 20*a* is provided with a first metal layer 200 or redistribution layer RDL1. Besides, the first memory unit 20 also has a wire bonding pad set 202*a*, a first original pad set 206, and a first intermediate pad set 208. The wire bonding pad set 202*a* includes command pads (such as XCLK,XCMD,XADD), two set power pads (such as Powers, GNDs), one data I/O pads (such as XDQ0-15, XDQS0-1) for the left die of the first memory unit 20, another data I/O pads (such as XDQ16-31, XDQS2-3) for the right die of the first memory unit 20, and the other data I/O pads (such as XDQ32-47, XDQS4-5) for coupled to the second memory unit 12 in FIG. 3C. The first intermediate pad set 208 also includes data I/O pads correspondingly connected to the other data I/O pads (such as XDQ32-47, XDQS4-5) through RDL1, and the second original pad set 122 of the second memory unit 12 in FIG. 3C will be bonded to the first intermediate pad set 208 of the first memory unit 20 in FIG. 7.

To sum up, the memory module provided by the present invention has a first memory unit and a second memory unit, and only the first memory unit is connected to a substrate by wire bonding, thereby reducing the total number of bonding wires and further reducing the volume of the packaging unit. In addition, part of the functions of the second memory unit can be disable and performed by the first memory unit to save power.

With the examples and explanations mentioned above, the features and spirits of the invention are hopefully well described. The present invention is not limited to the embodiment described herein.

What is claimed is:

1. A memory module, comprising:

a first memory die with a first surface and a third surface opposite to the first surface, wherein a first redistribution layer and a first original pad set are formed over the first surface;

a second memory die with a second surface and a fourth surface opposite to the second surface, wherein a second original pad set are formed over the second surface;

a wire bonding pad set disposed over the first surface of the first memory die, wherein the wire bonding pad set are electrically connected with the first original pad set through the first redistribution layer; and a plurality of wires bonded to the wire bonding pad set;

wherein the first memory die is bonded to the second memory die, the first surface of the first memory die faces the second surface of the second memory die, and the second original pad set are electrically connected with the wire bonding pad set, wherein the first memory die and the second memory die correspond to at least one different pad among the wire bonding pad set.

2. The memory module according to claim 1, wherein there is no wire bonded to the second memory die.

3. The memory module according to claim 1, wherein there is no pad set and redistribution layer disposed over the third surface of the first memory die, and there is no pad set and redistribution layer disposed over the fourth surface of the second memory die.

4. The memory module according to claim 1, wherein a first intermediate pad set are disposed over the first surface of the first memory die, and the first intermediate pad set are electrically connected with the first original pad set through the first redistribution layer.

5. The memory module according to claim 4, wherein the second original pad set of the second memory die are bonded to the first intermediate pad set of the first memory die.

6. The memory module according to claim 1, wherein a first intermediate pad set are disposed over the first surface of the first memory die, and the first intermediate pad set are electrically connected with the first original pad set through the first redistribution layer; wherein a second intermediate pad set are disposed over the second surface of the second memory die, and the second intermediate pad set are electrically connected with the second original pad set through a second redistribution layer.

7. The memory module according to claim 6, wherein the second intermediate pad set of the second memory die are bonded to the first intermediate pad set of the first memory die.

8. The memory module according to claim 6, wherein the position arrangement of the second intermediate pad set of the second memory die are mirrored with the position arrangement of the second original pad set of the second memory die along a horizontal direction or a vertical direction.

9. The memory module according to claim 1, wherein a data width in the wire bonding pad set is the same as that in the first original pad set and the same as that in the second original pad set.

10. The memory module according to claim 1, wherein a data width in the wire bonding pad set is the sum of that in the first original pad set and that in the second original pad set.

11. A memory module, comprising:

a first memory unit with a first surface, wherein a first original pad set and a first intermediate pad set are disposed over the first surface, and a first redistributed layer is over the first surface to connect the first original pad set with the first intermediate pad set;

a first wire bonding pad set and a second wire bonding pad set disposed over an peripheral position of the first surface; wherein the first wire bonding pad set and the second wire bonding pad set are connected with the first original pad set through the first redistributed layer; and a second memory unit with a second surface, and a second original pad set are disposed over the second surface;

wherein the second surface of the second memory unit is flipped and bonded to the first surface of the first memory unit, and the second original pad set are electrically connected with the first wire bonding pad set and the second wire bonding pad set through the first intermediate pad set and the first redistributed layer; and wherein no wire is bonded to the second memory unit.

12. The memory module according to claim 11, wherein the peripheral position over which the first wire bonding pad set and the second wire bonding pad set are disposed at least includes a first edge portion extending along a first direction and a second edge portion extending along a second direction, wherein the first direction is different from the second direction.

13. The memory module according to claim 11, the second wire bonding pad set comprising a first data pad set and a second data pad set, wherein an original data pad set of the first original pad set are directly connected to the first data pad set through the first redistributed layer, and an intermediate data pad set of the first intermediate pad set are directly connected to the second data pad set through the first redistributed layer.

14. The memory module according to claim 11, wherein the first memory unit comprises a first core circuit and a first peripheral circuit, the second memory unit comprises a second core circuit and a second peripheral circuit; wherein part of the second peripheral circuit is disable during the operation of the memory module.

15. The memory module according to claim 14, wherein part of the second peripheral circuit includes an internal regulated voltage source, a command controller, a clock circuit or an addressing decoding circuit.

16. The memory module according to claim 11, wherein the second memory unit does not include an internal regulated voltage source, a command controller, or a clock circuit.

* * * * *